(12) United States Patent
Tanaka

(10) Patent No.: US 7,795,921 B2
(45) Date of Patent: Sep. 14, 2010

(54) SEMICONDUCTOR INTEGRATED CIRCUIT AND METHOD OF REDUCING NOISE

(75) Inventor: Nobuyuki Tanaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 1148 days.

(21) Appl. No.: 11/439,147

(22) Filed: May 24, 2006

(65) Prior Publication Data

US 2006/0267738 A1 Nov. 30, 2006

(30) Foreign Application Priority Data

May 25, 2005 (JP) .............................. 2005-152156

(51) Int. Cl.
*H03K 19/00* (2006.01)
*H04L 7/00* (2006.01)
(52) U.S. Cl. .............................. 326/94; 326/93; 327/24; 375/355; 375/357; 375/368
(58) Field of Classification Search ............. 326/93–94; 327/24; 375/110, 118, 357; 340/14.61
See application file for complete search history.

(56) References Cited

U.S. PATENT DOCUMENTS 3,999,170 A * 12/1976 Lyman et al. .................. 365/63
4,464,769 A * 8/1984 Forsberg et al. ............. 375/368
6,636,080 B2 * 10/2003 Soda ............................ 327/24
7,164,742 B2 * 1/2007 McLeod ...................... 375/355
7,288,969 B1 * 10/2007 Sleigh et al. .................. 326/94
2002/0133730 A1 * 9/2002 Zabinski et al. ............. 713/400
2006/0091912 A1 * 5/2006 Ghosh et al. .................. 326/93

FOREIGN PATENT DOCUMENTS

| JP | 7-38535 | 2/1995 |
| JP | 2000-186685 | 10/2000 |
| JP | 2001-211057 | 8/2001 |

* cited by examiner

*Primary Examiner*—Vibol Tan
(74) *Attorney, Agent, or Firm*—Sughrue Mion, PLLC

(57) ABSTRACT

A semiconductor integrated circuit includes a sampling unit, a delay unit, a first operating unit and a second operating unit. The sampling unit samples an input signal supplied from an external circuit in synchronization with a clock signal, and outputs the sampled input signal as a first signal. The delay unit delays the first signal in synchronization with the clock signal, and outputs the delayed first signal as a second signal. The first operating unit operates whether a signal level of the input signal is sustained equal to or longer than a predetermined period based on the first and second signals, and outputs an output signal in synchronization with the clock signal when the signal level of the input signal is sustained equal to or longer than the predetermined period. A signal level of the output signal is sustained equal to or longer than the predetermined period. The second operating unit asynchronously controls the sampling unit based on the input signal and the output signal.

16 Claims, 6 Drawing Sheets

SEMICONDUCTOR INTEGRATED CIRCUIT AND METHOD OF REDUCING NOISE

BACKGROUND OF THE INVENTION

1. Field of the Invention

The present invention relates to a semiconductor integrated circuit and a method of reducing noise, and more particularly relates to an input circuit of a semiconductor integrated circuit and a method of reducing noise in the input circuit.

2. Description of the Related Art

It is well known that a CR filter is inserted into a former stage of an input terminal in order to remove a noise signal superimposed on an input signal. The CR filter removes high frequency signal in the input signal on which the noise signal is superimposed, and separates and extracts the input signal that is lower in frequency than the noise signal. For this reason, a time constant of the CR filter must be selected on the basis of characteristics of the input signal and the noise signal. Also, in many cases, the cutoff property of the filter must be made precipitous, which increases the number of parts. Thus, a circuit, which judges the effective input signal or the noise signal based on a continuation time of the input signal, is used in many cases. For example, Japanese Laid Open Patent Applications JP-A-Heisei, 07-38535 and JP-P 2001-211057A disclose such circuits.

The circuit disclosed in Japanese Laid Open Patent Application JP-A-Heisei, 07-38535 is installed on a data input side of a demodulating circuit for an asynchronous serial coding transmission method. This circuit is used for removing a single noise. This noise removing circuit has four D-type flip-flop circuits. The D-type flip-flop (1) is turned off at the rising of a clock signal when an input data is zero. The D-type flip-flop (1) is turned on at the rising of the clock signal when the single noise is generated in the off state, and turned off at the rising of a next clock signal. The D-type flip-flop (2) is turned off when the D-type flip-flop (1) is turned on by the generation of the single noise, and this is turned on when the flip-flop (1) is turned off. The D-type flip-flop (3) is cleared by the outputs of the D-type flip-flops (1) and (2) and the output of an exclusive-OR circuit. The D-type flip-flop (3) executes frequency dividing at the falling of the clock to generate a sampling clock signal. The D-type flip-flop (4) synchronizes and outputs the outputs of the D-type flip-flop (1) in the sampling clock signal and supplies to a demodulating circuit.

The circuit disclosed in Japanese Laid Open Patent Application JP-P 2001-211057A is the input filter circuit for filtering a data stream supplied through an input line. This circuit has a first register (1A), a clock input signal and switching devices (4, 5 and 8). The first register (1A) is the register inside a register chain (1) where a signal input terminal is connected to the input line (2). The clock input signal is supplied to a plurality of registers (1A, 1B and 1C) connected to a clock line (3). This is used to transfer a sampling signal (T) at a sampling frequency higher than a maximum data transfer frequency in the data stream. The switchers (4, 5 and 8) are connected to the register chain (1). When the output signals generated in the respective plurality of registers (1A, 1B and 1C) are at the same logic level, an output line (9) is switched to the logic levels of the signal outputs of the plurality of registers (1A, 1B and 1C).

This circuit is tend to be erroneously operated, when the noise signal synchronous with a clock cycle is superimposed on the input signal. Thus, when this noise signal is removed in accordance with the asynchronous characteristic of the noise, there is no other way but to make the register chain longer. This implies that a time constant becomes longer.

As a circuit for removing a noise signal independently of a filter constant, there is a circuit disclosed in Japanese Laid Open Patent Application JP-P 2000-286685A. This circuit has first and second registers, which are cascade-connected, so as to be operated in accordance with a filter clock signal corresponding to the filter constant, and this is the digital filter for filtering an input signal in accordance with a two-stage sampling method. A discrepancy detector is provided with: ExOR gates G1, G2; an AND gate G3, an OR gate G4; and a D-flip-flop FF3. The discrepancy detector is operated at a sampling clock SCLK which is higher in frequency than a filter clock FCLK, and detects noise. The discrepancy detector, when detecting the noise, switches and controls a selector S and prevents the output of FF1 from being supplied to FF2. The flip-flops FF1, FF2 of the two-stage cascade configuration is operated at the filter clock FCLK. Then, unless the noise is detected by the discrepancy detector, the FF1 holds/outputs an input signal "a" at the time of the sampling when there is the filter clock FCLK. Then, the FF2 outputs this input signal "a" as the input signal after the filtering at the time of a next sampling.

This circuit requires that the sampling clock is set to be higher than the input signal. Also, the circuit configuration is complex. Here, FIG. 1 is a circuit diagram showing an example of a conventional circuit, which detects an input signal with a predetermined signal length and then removes a noise signal.

This conventional circuit includes D-type flip-flops 110, 112 and 113, logical product circuits (hereinafter referred to as AND circuits) 114, 116 and logical sum circuits (hereinafter referred to as OR circuits) 115, 117. Each of the D-type flip-flops 110, 112 and 113 samples a signal supplied to an input terminal D in synchronization with a sampling clock CK, and outputs an output signal from an output terminal Q. The D-type flip-flop 110 receives an input signal Din from an external circuit, and outputs an output signal indicating a sampling result to a node A. This output signal at the node A is supplied to the input terminal D of the D-type flip-flop 112 at the next stage, the AND circuit 114 and the OR circuit 115. An output signal at a node B of the D-type flip-flop 112 is supplied to the AND circuit 114 and the OR circuit 115. An output signal at a node C of the AND circuit 114 is supplied to the OR circuit 117. An output signal at a node D of the OR circuit 115 is supplied to the AND circuit 116. The AND circuit 16 also receives an output signal Dout of the D-type flip-flop 113. An output signal at a node E of the AND circuit 116 is supplied to the OR circuit 117. An output signal at a node F of the OR circuit 17 is supplied to the D-type flip-flop 113. The output signal at the D-type flip-flop 13 becomes the output Dout in this filtering circuit.

The D-type flip-flop 110 of the first stage is the circuit for sampling the input signal. The D-type flip-flop 112 of the next stage is the circuit for delaying the sampled signal. The combination circuit carries out the noise removal judgment whether or not the signals are at the same level on the basis of this sampled signal and this delayed sampled signal, and then supplies a result signal to the D-type flip-flop 13. Here, whether or not it is the noise is judged, on the bases of the signal level corresponding to one cycle in the sampling cycle as a constant period, namely, the two samplings.

An operation of this circuit will be described below. FIG. 2 is a timing chart showing an operation of the conventional circuit. In FIG. 2, (a) shows the clock signal CK, (b) and (i) show the input signal Din and the output signal Dout, respectively, and (c) to (h) show the signals at the nodes A to F, respectively. In synchronization with the rising of the clock signal CK, each of the D-type flip-flops 110, 112 and 113 samples the signal applied to each terminal D. Symbols T1 to T9 are assigned to the rising timings of this clock signal CK.

The input signal Din has a pulse signal of a level "High", which does not fulfill one cycle near the time T2, as shown in FIG. 2(b). The D-type flip-flop 110 samples the level "High" in synchronization with the clock signal CK, and then sets the output to the level "High" as shown in FIG. 2(c). At the time T3, since the input signal Din is at a level "Low", the D-type flip-flop 110 outputs the level "Low". Thus, the node A becomes in the state of the level "High" between the time T2 and the time T3 (FIG. 2 (c)).

The D-type flip-flop 112 samples the states of the node A. Thus, the output signal at the node B of the D-type flip-flop 112 becomes in the state where the state of the node A is delayed by one cycle, as shown in FIG. 2(d). That is, the node B becomes in the state of the level "High" between the time T3 and the time T4.

The AND circuit 114 outputs the logical product between the states of the nodes A and B. Thus, as shown in FIG. 2(e), the node C does not become at the level "High" between the time T2 and the time T4. Since the OR circuit 115 outputs the logical sum between the states of the nodes A and B, as shown in FIG. 2(f), the node D is at the level "High" between the time T2 and the time T4. The AND circuit 116 outputs the logical product between the node D and the output signal Dout. Since the output signal Dout is at the level "Low" between the time T2 and the time T4 as shown in FIG. 2(i), the node E is still at the level "Low" between the time T2 and the time T4 as shown in FIG. 2(g). Thus, the output of the OR circuit 117 is still at the level "Low" as shown in FIG. 2(h). Then, the D-type flip-flop 113 holds the level "Low" as shown in FIG. 2(i). Hence, in the case of the input of the signal, which is at the level "High" only at the time of one sampling that is the noise signal, it is known that the output signal of this circuit is not changed and the noise signal is removed.

The case that an expected input signal is supplied will be explained next, wherein the input signal Din is at the level "High" between the time T5 and the time T6 as shown in FIG. 2(b). The signal level at the node A becomes the level "High" in the period between the time T5 and the time T7 as shown in FIG. 2(c), because the input signal Din is at the level "High" at the time T5 and the time T6. The D-type flip-flop 112, which samples this signal at the node A at the timing of the clock signal CK, outputs the signal, which is delayed by one clock, to the node B. That is, the signal level of the node B is the level "High" in the period between the time T6 and the time T8 (FIG. 2(d)).

Thus, the signal level of the node C that is the output signal of the AND circuit 114 becomes the level "High" only in the one-clock period between the time T6 and the time T7 (FIG. 2(e)). Also, the signal level of the node D that is the output signal of the OR circuit 115 becomes the level "High" in the three-clock period between the time T5 and the time T8 (FIG. 2(f)). When the node C becomes at the level "High", the output signal at the node F of the OR circuit 117 becomes at the level "High". Thus, the D-type flip-flop 113 samples the level "High" at the time T7, and outputs the level "High" to the output signal Dout as shown in FIG. 2(i).

When the output signal Dout becomes at the level "High", the AND circuit 116 outputs the signal level of the node D to the node E. Thus, the signal level of the node E is the level "High" between the time T7 when the node D becomes at the level "High" and the time T8 when the node D becomes at the level "Low" (FIG. 2(g)). Since the signal level of the node E is "High", the output signal of the OR circuit 117 is at the level "High" until the time T8 (FIG. 2(h)). Since the signal level of the node F is the level "High" until the time T8, the output Dout of the D-type flip-flop 113 is at the level "High" until the time T9 (FIG. 2(i)). That is, the signal where the level "High" is sampled continuously two times at the time T5 and the time T6 outputs the signal Dout which is at the level "High" in the two-clock period between the time T7 and the time T9.

In this way, the input signal Din which is at the level "High" in the short period is not reflected as the noise in the output Dout. On the other hand, the signal which is continued to some degree (in this case, the two-sampling period) is reflected as the normal input signal in the output Dout. However, as indicated by the dashed lines in FIG. 2(b), even in the case when the level "High" is not continued in the middle near the time T5 and the time T6 where the D-type flip-flop 110 samples the input signal Din, this may be operated as if the level "High" is continued from the time T5 to the time T6. Thus, this circuit is assumed to be used in the environment where the noise is sporadically generated, namely, the environment where the noise, which is sampled continuously two or more times, is removed in view of probability.

This operation is equal even if the effective signal level is "Low". FIG. 3 is a timing chart showing another operation of the conventional circuit. In FIG. 3, (a) shows the clock signal CK, (b) and (i) show the input signal Din and the output signal Dout, respectively, and (c) to (h) show the signals at the nodes A to F, respectively. As shown in FIG. 3, (a) to (i), even if the input signal Din, which becomes at the level "Low" only at the time T2, is supplied, the output signal Dout of the D-type flip-flop 113 is still at the level "High". The input signal which becomes at the level "Low" at the time T5 and the time T6 is reflected in the output signal so as to be at the level "Low" in the two-clock period. As indicated by the dashed lines in FIG. 3(b), under the assumption that this is at the level "High" in the middle between the time T5 and the time T6 and that the state is continued even if the level "Low" is not continued, the output signal Dout is at the level "Low" between the time T7 and the time T9.

In this way, the synchronous noise removal effectively functions for the sporadic noise. However, under the environment of various noises or under the situation where the noise is apt to be generated in synchronization with the sampling cycle, the noise cannot be perfectly removed in those circuits.

SUMMARY OF THE INVENTION

In order to achieve an aspect of the present invention, the present invention provides a semiconductor integrated circuit including: a sampling unit configured to sample an input signal supplied from an external circuit in synchronization with a clock signal, and output the sampled input signal as a first signal; a delay unit configured to delay the first signal in synchronization with the clock signal, and output the delayed first signal as a second signal; a first operating unit configured to operate whether or not a signal level of the input signal is sustained equal to or longer than a predetermined period based on the first and second signals, and output an output signal in synchronization with the clock signal when the signal level of the input signal is sustained equal to or longer than the predetermined period, wherein a signal level of the output signal is sustained equal to or longer than the predetermined period; and a second operating unit configured to asynchronously control the sampling unit based on the input signal and the output signal.

In the present invention, this circuit can judge the effective input signal or the noise signal based on whether or not the signal level of the input signal is sustained in the predetermined period. Therefore, if the input signal is noise that is not sustained in the predetermined period, this circuit does not output the output signal in response to the input signal. Hence, the output signal is not affected by the noise and the noise can be reduced.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a semiconductor integrated circuit according to the present invention will be described below with reference to the attached drawings.

Figure 4:
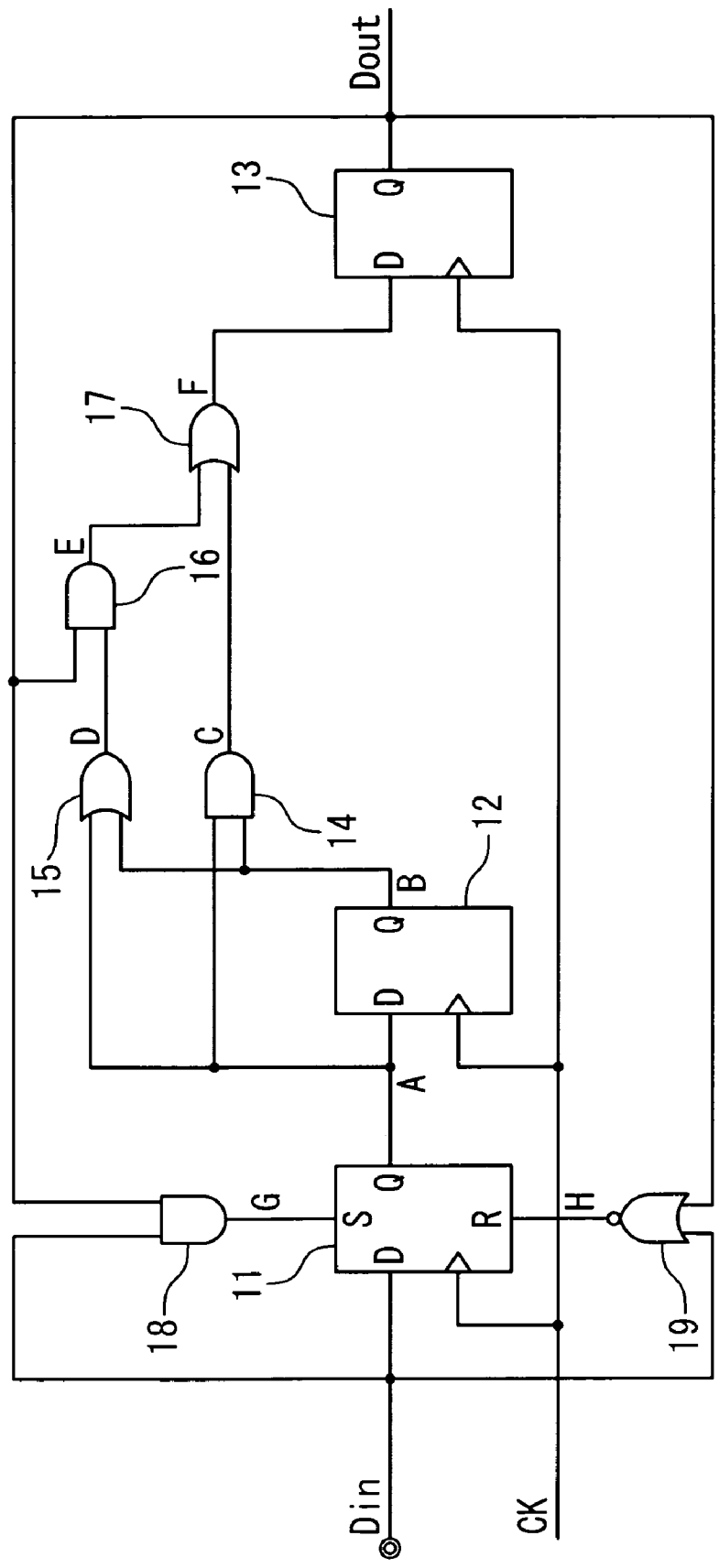
FIG. 4 is a circuit diagram showing a circuit of a signal input unit in a semiconductor integrated circuit according to an embodiment of the present invention.

FIG. 4 is a circuit diagram showing a circuit of a signal input unit in a semiconductor integrated circuit according to an embodiment of the present invention. The circuit of a signal input unit for removing a noise includes D-type flip-flops 11, 12 and 13, logical product circuits (hereinafter referred to as AND circuits) 14, 16, 18, logical sum circuits (hereinafter referred to as OR circuits) 15, 17, and a NOR circuit 19.

A clock signal CK is supplied to clock terminals of the D-type flip-flops 11, 12 and 13. An input signal Din is supplied to an input terminal D of the D-type flip-flop 11, the AND circuit 18 and the NOR circuit 19. An output signal Dout is supplied to the AND circuit 16, the AND circuit 18 and the NOR circuit 19. An output signal from an output terminal of the AND circuit 18 through a node G is supplied to a set terminal S of the D-type flip-flop 11. An output signal from an output terminal of the NOR circuit 19 through a node H is supplied to a reset terminal R of the D-type flip-flop 11. An output signal from an output terminal Q of the D-type flip-flop 11 through a node A is supplied to the input terminal D of the D-type flip-flop 12 and input terminals of the AND circuit 14 and the OR circuit 15. An output signal from an output terminal Q of the D-type flip-flop 12 through a node B is supplied to input terminals of the AND circuit 14 and the OR circuit 15. An output signal from an output terminal of the AND circuit 14 through a node C is supplied to an input terminal of the OR circuit 17. An output signal from an output terminal of the OR circuit 15 through a node D is supplied to an input terminal of the AND circuit 16. An output signal from an output terminal of the AND circuit 16 through a node E is supplied to an input terminal of the OR circuit 17. An output signal from an output terminal of the OR circuit 17 through a node F is supplied to the input terminal D of the D-type flip-flop 13.

Each of the D-type flip-flops 11, 12 and 13 samples the signal supplied to the input terminals D in synchronization with the rising of the clock signal CK, and outputs a sampled signal from output terminals Q. The D-type flip-flop 11 sets the output terminal Q to the level "High" when the signal supplied to the set terminal S becomes at the level "High". The D-type flip-flop 11 sets the output terminal Q to the level "Low" when the signal supplied to the reset terminal R becomes at the level "High". That is, the D-type flip-flop 11 is the D-type flip-flop with an asynchronous set/reset.

The D-type flip-flop 11 functions as the sampling circuit for sampling the input signals Din in synchronization with the rising of the clock signal CK and transmitting to an inner circuit. The AND circuit 18, when both of the input signal Din and the output signal Dout are at the level "High", outputs the output signal with the level "High" and sets the D-type flip-flop 11. The NOR circuit 19, when both of the input signal Din and the output signal Dout are at the level "Low", outputs the output signal with the level "High" and resets the D-type flip-flop 11. That is, the D-type flip-flop 11 is asynchronously set/reset when the input signal Din and the output signal Dout become the signal with the same level.

The D-type flip-flop 12 delays the output signal through the node A, which is the sampled input signal Din, by one clock and outputs to the node B. The AND circuit 14 sets the node C to the level "High", when both of the nodes A, B are at the level "High". The OR circuit 15 sets the node D to the level "Low", when both of the nodes A, B are at the level "Low". The AND circuit 16 reflects the level state of the node D to the node E when the output signal Dout is at the level "High", and outputs the output signal with the level "Low" to the node E when the output signal Dout is at the level "Low". The OR circuit 17 determines the logical sum of the node C and the node E, and outputs a result signal to the node F. The D-type flip-flop 13 samples the result signal of the node F at the timing of the clock signal CK, and outputs the output signal Dout.

Figure 5:
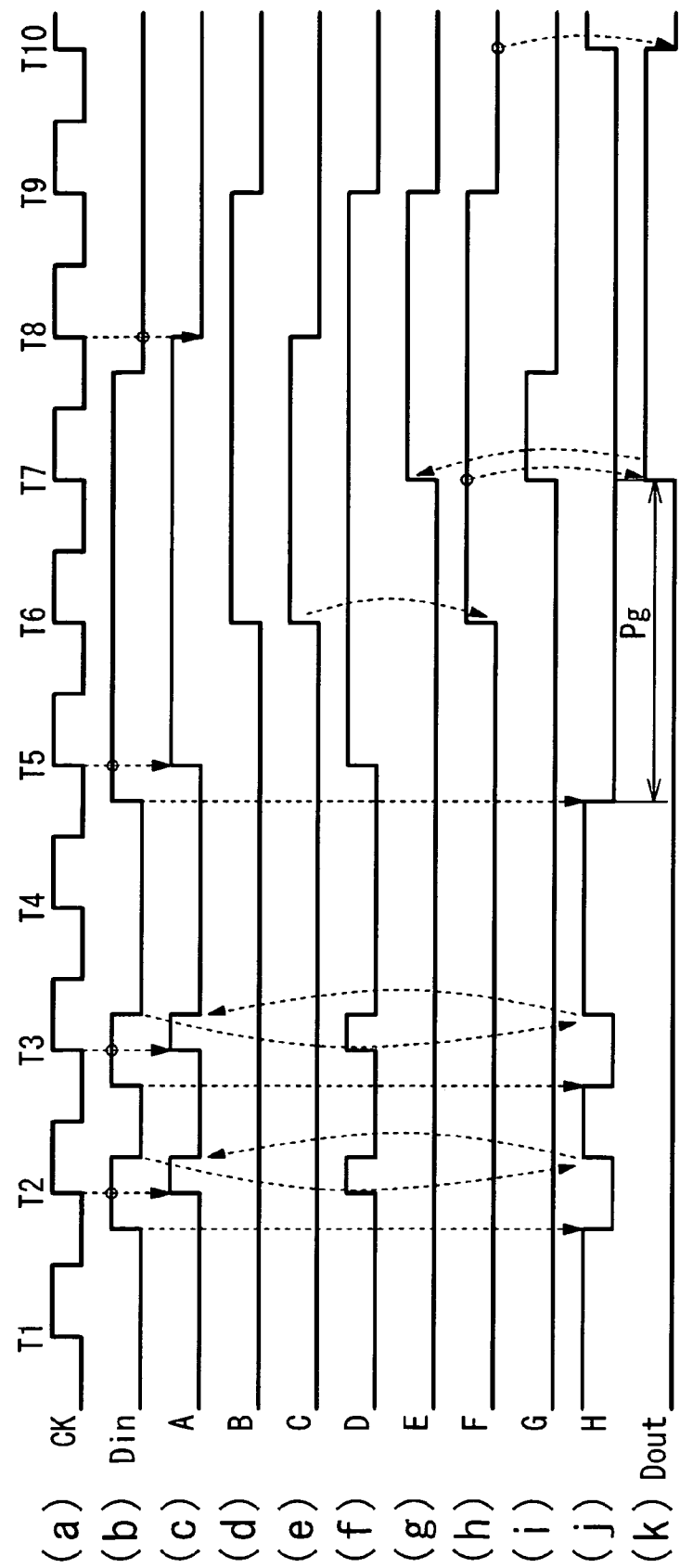
FIG. 5 is a timing chart showing an operation of the circuit of the signal input unit in the semiconductor integrated circuit according to the embodiment of the present invention.

An operation of this circuit will be described below. FIG. 5 is a timing chart showing an operation of the circuit of the signal input unit in the semiconductor integrated circuit according to the embodiment of the present invention. In FIG. 5, (a) shows the clock signal CK, (b) and (k) show the input signal Din and the output signal Dout, respectively, and (c) to (j) show the signals at the nodes A to H, respectively. FIG. 5 show the circuit operation when the input signal Din is changed from the level "Low" to the level "High". FIG. 5(a) shows the clock signal CK that gives the sampling timing. In synchronization with the rising of the clock signal CK, each of the D-type flip-flops 11 to 13 samples the signal applied to the input terminal D and output to the output terminals Q. Symbols T1 to T10 are assigned to the rising timings of this clock signal CK.

Figure 1:
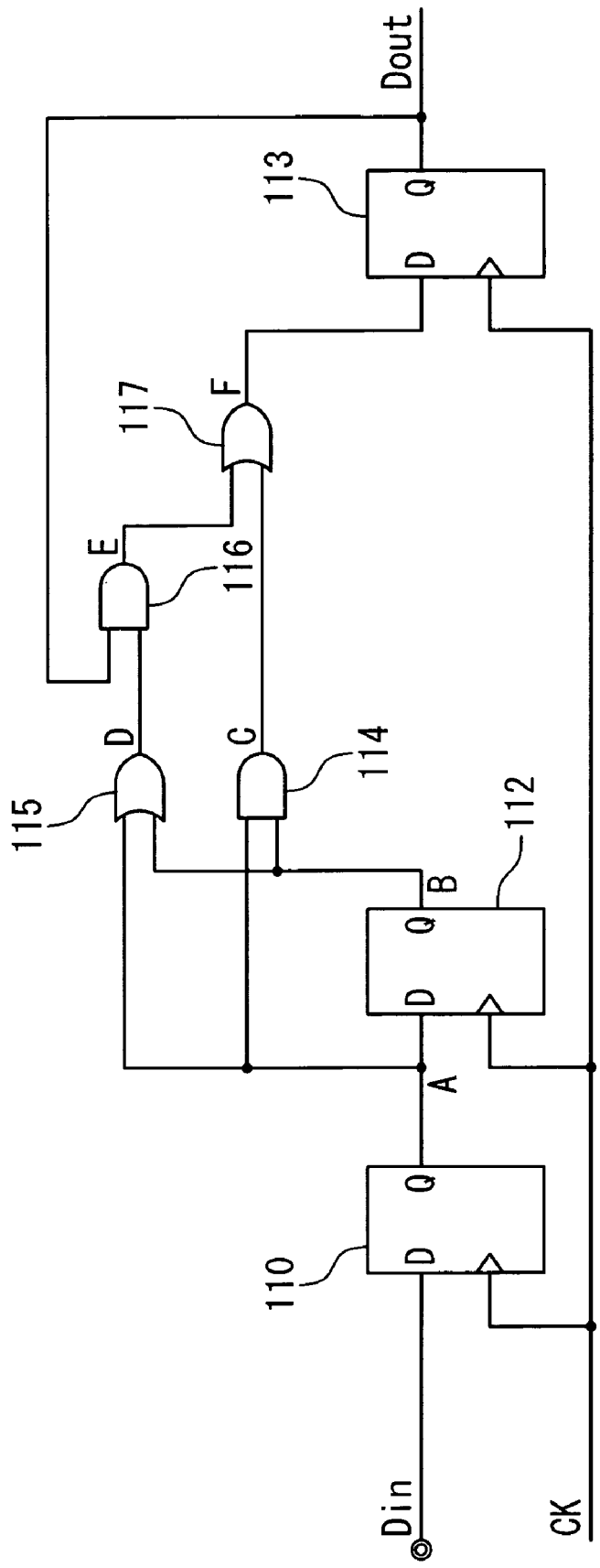
FIG. 1 is a circuit diagram showing an example of a conventional noise removing circuit.
Figure 2:
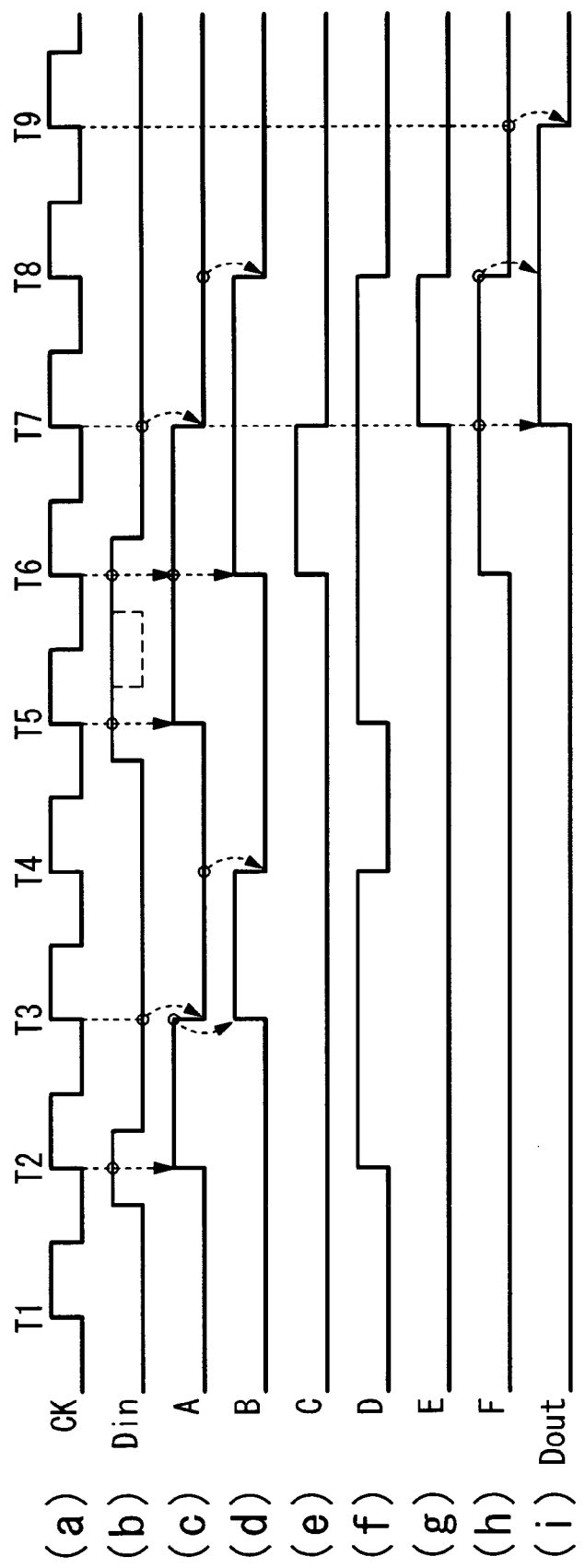
FIG. 2 is a timing chart showing an operation of the conventional noise removing circuit.
Figure 3:
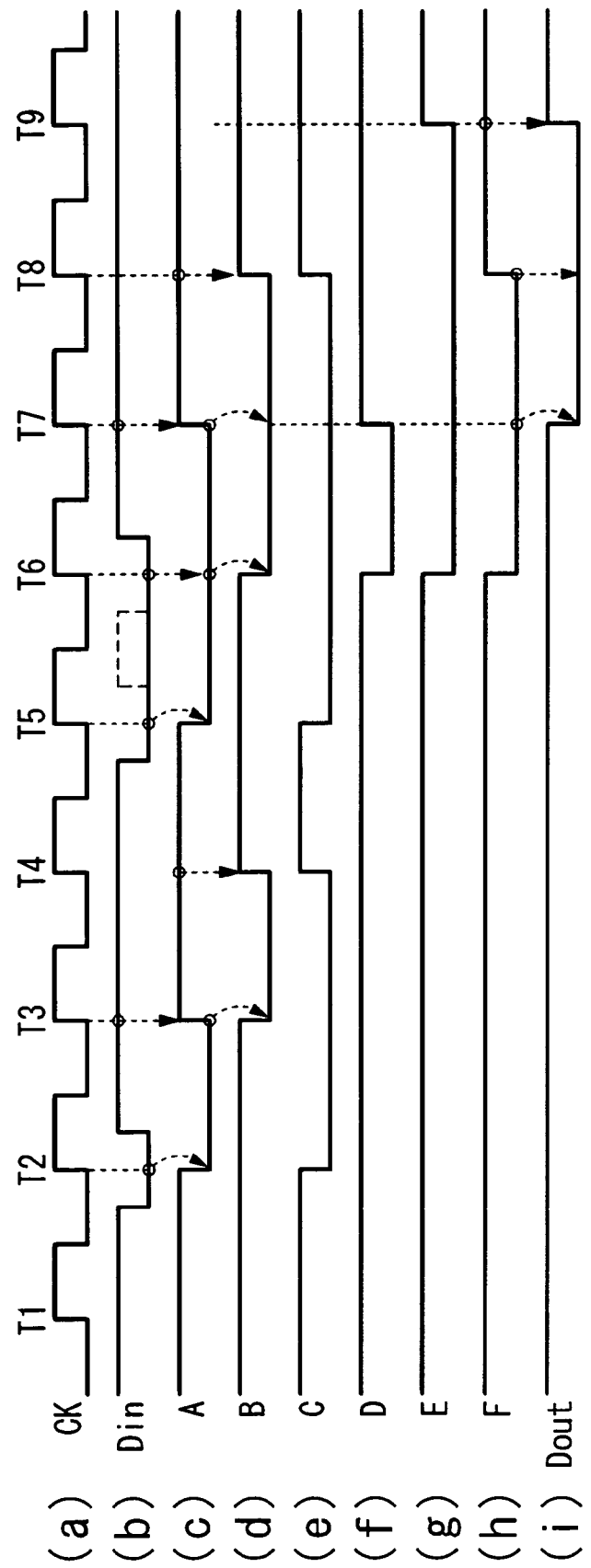
FIG. 3 is a timing chart showing another operation of the conventional noise removing circuit.

In the state where the input signal Din and the output signal Dout are at the level "Low", the nodes A to G are at the level "Low", and the node H is at the level "High". At first, as shown in FIG. 5(b), an input signal Din which is at the level "High" is supplied near the time T2 and the time T3. Such a signal was detected as one pulse in the conventional circuit as described before with reference to FIG. 2. When the input signal Din becomes at the level "High", as shown in FIG. 5(j), the NOR circuit 19 outputs the output signal with the level "Low" and releases the reset state of the D-type flip-flop 11.

The D-type flip-flop 11 samples the input signals Din at the time T2 and once sets the node A to the level "High" (FIG. 5(c)). After that, when the input signal Din becomes at the level "Low", the NOR circuit 19 outputs the output signal with the level "High" to the node H and resets the D-type flip-flop 11. Since the D-type flip-flop 11 is reset, the node A is returned to the level "Low".

Similarly, after the input signal Din becomes at the level "High", the node A becomes once at the level "High" at the time T3. Then, when the input signal Din becomes at the level "Low", the node A is returned to the level "Low". The change of the potential level in this node A is not sustained until the time when the D-type flip-flop 12 carries out the sampling. Therefore, the D-type flip-flop 12 does not sample the signal (potential) with the level "High" at the node A. Hence, the level change of the input signal Din is not transported to the D-type flip-flop 13. The signal level, which is not sustained although it is synchronous with the clock signal CK, has no influence on the output signal Dout as mentioned above (FIG. 5(k)).

Next, the input signal Din where the level "High" is sustained from the time T5 to the time T7 is supplied (FIG. 5(b)). When the input signal Din becomes at the level "High", the NOR circuit 19 outputs the output signal with the level "Low" to the node H and releases the reset of the D-type flip-flop 11 (FIG. 5(j)). As shown in FIG. 5(c), the D-type flip-flop 11 samples the input signals Din at the time T5 and sets the node A to the level "High". Until the D-type flip-flop 11 samples the input signal Din with the level "Low" at the time T8, the node A is still sustained at the level "High".

At the time T6, the D-type flip-flop 12 samples the signal (potential) of the node A and sets the node B to the level "High" as shown in FIG. 5(d). Since the node A is at the level "High" until the time T8, the node B is at the level "High" until the time T9. Thus, the AND circuit 14 for outputting the logical product of the nodes A, B sets the node C to the level "High" from the time T6 to the time T8 as shown in FIG. 5(e). Also, the OR circuit 15 for outputting the logical sum of the nodes A, B sets the node D to the level "High" from the time T5 to the time T9 as shown in FIG. 5(f).

Since the node C becomes at the level "High", the OR circuit 17 sets the node F to the level "High" from the time T6 as shown in FIG. 5(h). At the time T7, the D-type flip-flop 13 samples the signal (potential) with the level "High" of the node F and sets the output signal Dout to the level "High" as shown in FIG. 5(k). When the output signal Dout becomes at the level "High", the node E becomes at the level "High", and its state is sustained until the node B becomes at the level "Low" (FIG. 5(g)). Since the node E sustains the level "High" until the time T9, the node F is also at the level "High" until the time T9 (FIG. 5(h)). Thus, the D-type flip-flop 13 samples the signal (potential) with the level "High" until the sampling at the time T9, and samples the signal (potential) with the level "Low" at the time T10. That is, the output signal Dout sustains the level "High" until the time T10 and becomes at the level "Low" by the sampling at the time T10 (FIG. 5(k)).

In this way, the input signal Din which does not fulfill the two cycles of the clock is judged to be the noise and is not reflected into the output signal Dout. The input signal Din that sustains for two or more cycles of the clock (three or more samplings) is transmitted to the output signal Dout. In other words, in order to reflect the change of the input signal Din into the output signal Dout, the condition is required that the input signal Din sustains the level "High" in a period "Pg" until the rising of the output signal Dout after the rising of the input signal Din.

Figure 6:
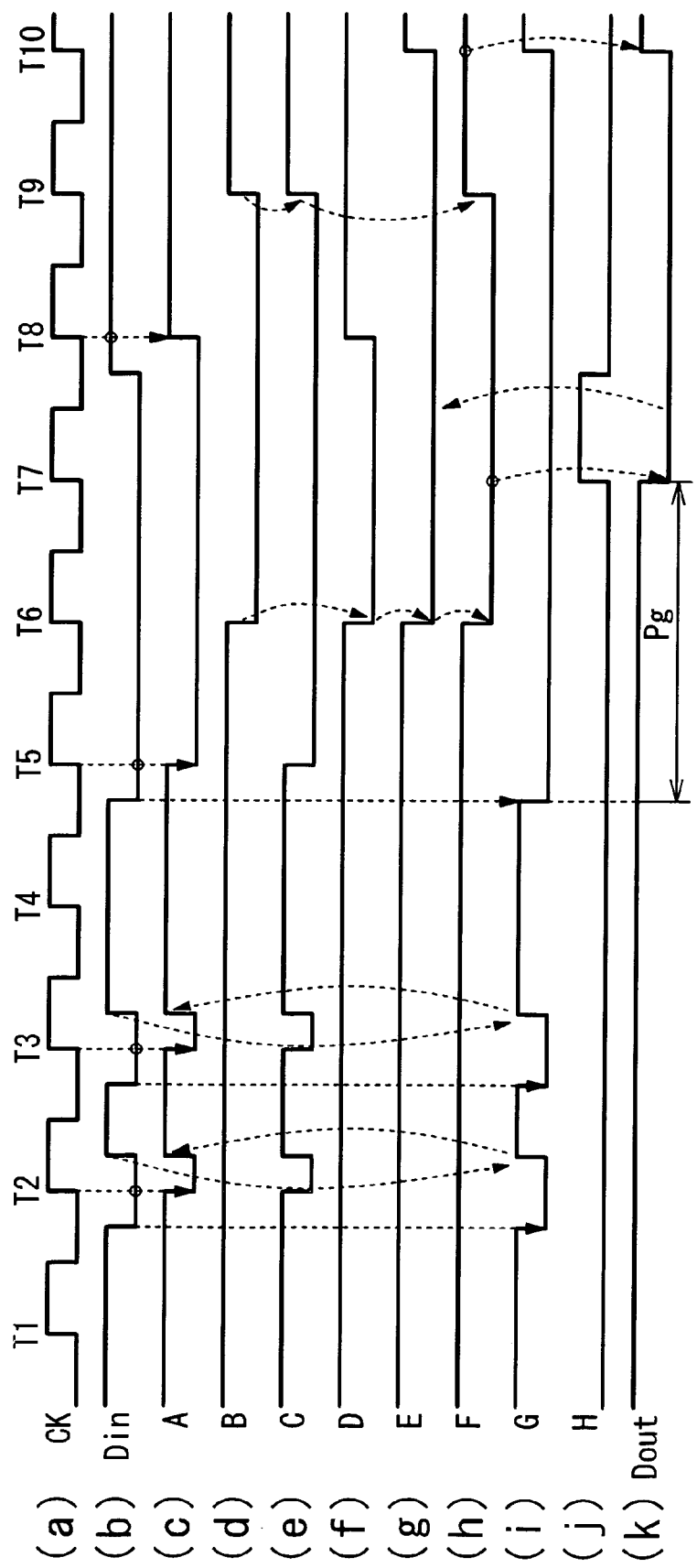
FIG. 6 is a timing chart showing another operation of the circuit in the signal input unit in the semiconductor integrated circuit according to the embodiment of the present invention.

FIG. 6 is a timing chart showing another operation of the circuit of the signal input unit in the semiconductor integrated circuit according to the embodiment of the present invention. As shown in FIG. 6, this is operated even when the signal level is changed from the level "High" to the level "Low". In the state that the output signal Dout is at the level "High", the input signal Din and the nodes A to G are at the level "High", and the node H is at the level "Low". The input signal Din which is at the level "Low" near the time T2 and the time T3 is supplied (FIG. 6(b)). When the input signal Din becomes at the level "Low", the AND circuit 18 outputs the output signal with the level "Low" and releases the set state of the D-type flip-flop 11 (FIG. 6(i)). The D-type flip-flop 11 samples the input signals Din at the time T2 and sets the node A to the level "Low" (FIG. 6(c)). After that, when the input signal Din becomes at the level "High", the AND circuit 18 outputs the output signal of the level "High" to the node G and sets the D-type flip-flop 11 (FIG. 6(i)). Since the D-type flip-flop 11 is set, the node A is turned to the level "High" (FIG. 6(c)).

Similarly after the input signal Din becomes at the level "Low", the node A becomes once at the level "Low" at the time T3. Then, when the input signal Din becomes at the level "High", the node A is returned to the level "High" (FIG. 6(c)). The change of the potential level in this node A is not sustained until the time when the D-type flip-flop 12 carries out the sampling. Therefore, the D-type flip-flop 12 does not sample the signal (potential) with the level "Low" at the node A (FIG. 6(d)). Hence, the level change in the input signal Din is not transported to the D-type flip-flop 13 (FIG. 6(k)).

Next, the input signal Din where the level "Low" is sustained from the time T5 to the time T7 is supplied (FIG. 6(b)). When the input signal Din becomes at the level "Low", the AND circuit 18 outputs the output signal with the level "Low" to the node G and releases the set of the D-type flip-flop 11 (FIG. 6(i)). The D-type flip-flop 11 samples the input signals Din at the time T5 and sets the node A to the level "Low". Until the D-type flip-flop 11 samples the input signal Din with the level "High" at the time T8, the node A is still sustained at the level "Low" (FIG. 6(c)).

At the time T6, the D-type flip-flop 12 samples the signal (potential) of the node A and sets the node B to the level "Low" (FIG. 6(d)). Since the node A is at the level "Low" until the time T8, the node B is at the level "Low" until the time T9. Thus, the AND circuit 14 for outputting the logical product of the nodes A, B sets the node C to the level "Low" from the time T5 to the time T9 (FIG. 6(e)). Also, the OR circuit 15 for outputting the logical sum of the nodes A, B sets the node D to the level "Low" from the time T6 to the time T8 (FIG. 6(f)).

Since the node D becomes at the level "Low", the AND circuit 16 sets the node E to the level "Low" (FIG. 6(g)). Since the node E becomes at the level "Low", the OR circuit 17 sets the node F to the level "Low" (FIG. 6(h)). At the time T7, the D-type flip-flop 13 samples the signal (potential) with the level "Low" of the node F and sets the output signal Dout to the level "Low" (FIG. 6(k)). When the output signal Dout becomes at the level "Low", the node E becomes at the level "Low". Then, until the time T10 when the output signal Dout becomes at the level "High", the level "Low" is sustained (FIG. 6(g)).

On the other hand, since the node C becomes at the level "High" at the time T9 (FIG. 6(e)), the node F becomes at the level "High" after the time T9 (FIG. 6(h)). The D-type flip-flop 13 samples the signal (potential) with the level "Low" until the time T9 and samples the signal (potential) with the level "High" at the time T10, of the node F. Hence, the output signal Dout becomes at the level "Low" from the time T7 to the time T10 and becomes at the level "High" after the time T10 (FIG. 6(k)).

In this way, even when the input signal Din is changed from the level "High" to the level "Low", the input signal Din which does not fulfill the two cycles of the clock is judged to be the noise and is not reflected into the output signal Dout. The input signal Din that sustains for two or more cycles of the clock (three or more samplings) is transmitted to the output signal Dout. In other words, in order to reflect the change of the input signal Din into the output signal Dout, the condition is required that the input signal Din sustains the level "Low" in a period "Pg" until the falling of the output signal Dout after the falling of the input signal Din.

This circuit can judge the effective input signal or the noise signal, in accordance with the fact that the signal level continues for the period "Pg". The delay time until the output of the output signal corresponding to the effective input signal corresponds to the two clocks. This is especially effective for the case where the noise signal is synchronous with the clock signal or where it is used under the environment of the various noises. That is, as described in the conventional circuit, as compared with the circuit where the samplings are carried out in many times so as to prevent the input of the noise in view of probability, the circuit scale can be downsized and the delay time can be reduced.

The period "Pg" can be set by connecting the D-type flip-flops 12 in the multiple stages. When one stage of the D-type flip-flop is added to the later stage of the D-type flip-flop 12 so that an output of that D-type flip-flop is used as a node B, the rising/falling of the node B is delayed by one clock from the above-mentioned timing. Thus, the period "Pg" where the signal level must be sustained can be made longer by one clock.

Also, the output of this noise removing circuit is used as the output Dout, in this case. However, when the delay from the clock signal at the rising/falling is allowable, the signal of the node F may be used as the output signal.

As mentioned above, when the noise signal superimposed on the input signal is coincident with the clock synchronization, the countermeasure by means of the externally attached circuit such as LPF (low pass filter) and the like has been conventionally required. However, in the present invention, since this circuit is inserted into the input unit which requires the countermeasure, the externally attached circuit is not required, which can drop the system cost.

According to the present invention, it is possible to provide the semiconductor integrated circuit which does not receive the noise signal erroneously. Also, according to the present invention, since an externally attached circuit is not required, the cost can be reduced.

It is apparent that the present invention is not limited to the above embodiment that may be modified and changed without departing from the scope and spirit of the invention.

What is claimed is:

1. A semiconductor integrated circuit comprising:
   a sampling unit configured to sample an input signal supplied from an external circuit in synchronization with a clock signal, and output said sampled input signal as a first signal;
   a delay unit configured to delay said first signal in synchronization with said clock signal, and output said delayed first signal as a second signal;
   a first operating unit configured to operate whether or not a signal level of said input signal is sustained equal to or longer than a predetermined period based on said first and second signals, and output an output signal in synchronization with said clock signal when said signal level of said input signal is sustained equal to or longer than said predetermined period, wherein a signal level of said output signal is sustained equal to or longer than said predetermined period; and
   a second operating unit configured to asynchronously control said sampling unit based on said input signal and said output signal.

2. The semiconductor integrated circuit according to claim 1, wherein said sampling unit includes a first flip-flop, and
   said first flip-flop is controlled by said second operating unit to be in at least one of a set state in which said first flip-flop asynchronously outputs a signal corresponding to logical truth and a reset state in which said first flip-flop asynchronously outputs a signal corresponding to logical false, based on said input signal and said output signal.

3. The semiconductor integrated circuit according to claim 1, wherein when a signal level of said input signal coincides with a signal level of said output signal, said second operating unit controls said sampling unit to output said first signal of which signal level coincides with that of said input signal.

4. The semiconductor integrated circuit according to claim 1, wherein said second operating unit includes:
   a logical product circuit configured to calculate a logical product between said input signal and said output signal, and
   a logical sum circuit configured to calculate a logical sum between said input signal and said output signal,
   wherein said logical product circuit sets said sampling unit in a set state when signal levels of said input signal and said output signal coincide with a signal level of logical truth,
   said logical sum circuit sets said sampling unit in a reset state when signal levels of said input signal and said output signal coincide with a signal level of logical false, and
   said sampling unit asynchronously outputs a signal corresponding to logical truth in said set state, and said sampling unit asynchronously outputs a signal corresponding to logical false in said reset state.

5. The semiconductor integrated circuit according to claim 4, wherein said sampling unit includes a first flip-flop, which is controlled to be in at least one of said set state and said reset state by said second operating unit.

6. The semiconductor integrated circuit according to claim 1, wherein said delay unit includes a second flip-flop configured to output said second signal by sampling said first signal in response to said clock signal.

7. The semiconductor integrated circuit according to claim 1, wherein said delay unit includes a plurality of flip-flops with multistage connection,
   a first-stage flip-flop of said plurality of flip-flops samples said first signal in response to said clock signal, and
   a last-stage flip-flop of said plurality of flip-flops outputs said second signal in response to said clock signal.

8. The semiconductor integrated circuit according to claim 1, wherein said first operating unit includes:
   a combination circuit configured to operate whether or not a signal level of said input signal is sustained equal to or longer than said predetermined period based on said first and second signals, and a third flip-flop configured to sample a signal outputted from said combination circuit in response to said clock signal, and output said output signal.

9. A method of reducing noise in an input circuit of a semiconductor integrated, wherein said input circuit comprises:
- a sampling unit;
- a delay unit;
- a first operating unit; and
- a second operating unit said method comprising:
(a) said sampling unit sampling an input signal supplied from an external circuit in synchronization with a clock signal, and outputting said sampled input signal as a first signal;
(b) said delay unit delaying said first signal in synchronization with said clock signal, and outputting said delayed first signal as a second signal;
(c) a first operating unit operating whether or not a signal level of said input signal is sustained equal to or longer than a predetermined period based on said first and second signals, and outputting an output signal in synchronization with said clock signal when said signal level of said input signal is sustained equal to or longer than said predetermined period, wherein a signal level of said output signal is sustained equal to or longer than said predetermined period; and
(d) a second operating unit asynchronously controlling said sampling unit based on said input signal and said output signal.

10. The method of reducing noise according to claim 9, wherein said sampling unit includes a first flip-flop, and
said step (d) includes:
(d1) said second operating unit controlling said first flip-flop to be in at least one of a set state in which said first flip-flop asynchronously outputs a signal corresponding to logical truth and a reset state in which said first flip-flop asynchronously outputs a signal corresponding to logical false, based on said input signal and said output signal.

11. The method of reducing noise according to claim 9, wherein said step (d) includes:
(d2) said second operating unit controlling said sampling unit to output said first signal of which signal level coincides with that of said input signal, when a signal level of said input signal coincides with a signal level of said output signal.

12. The method of reducing noise according to claim 9, wherein said second operating unit includes:
- a logical product circuit configured to calculate a logical product between said input signal and said output signal, and
- a logical sum circuit configured to calculate a logical sum between said input signal and said output signal, said step (d) includes:
(d3) said logical product circuit setting said sampling unit in a set state when signal levels of said input signal and said output signal coincide with a signal level of logical truth, and
(d4) said logical sum circuit setting said sampling unit in a reset state when signal levels of said input signal and said output signal coincide with a signal level of logical false,
said step (a) includes:
(a1) said sampling unit asynchronously outputting a signal corresponding to logical truth in said set state, and said sampling unit asynchronously outputs a signal corresponding to logical false in said reset state.

13. The method of reducing noise according to claim 12, wherein said sampling unit includes a first flip-flop, and
said step (d) includes:
(d5) said second operating unit controlling said first flip-flop to be in at least one of said set state and said reset state.

14. The method of reducing noise according to claim 9, wherein said delay unit includes a second flip-flop, and
said step (d) includes:
(d1) said second flip-flop outputting said second signal by sampling said first signal in response to said clock signal.

15. The method of reducing noise according to claim 9, wherein said delay unit includes a plurality of flip-flops with multistage connection,
said step (d) includes:
(d2) a first-stage flip-flop of said plurality of flip-flops sampling said first signal in response to said clock signal, and
(d3) a last-stage flip-flop of said plurality of flip-flops outputting said second signal in response to said clock signal.

16. The method of reducing noise according to claim 9, wherein said first operating unit includes:
- a combination circuit, and
- a third flip-flop, wherein said step (c) includes:
(c1) said combination circuit operating whether or not a signal level of said input signal is sustained equal to or longer than said predetermined period based on said first and second signals, and
(c2) said third flip-flop sampling as signal outputted from said combination circuit in response to said clock signal, and output said output signal.

* * * * *